(12) United States Patent
Takagi et al.

(10) Patent No.: US 8,824,511 B2
(45) Date of Patent: Sep. 2, 2014

(54) CLOCK SYNCHRONIZATION SYSTEM, NODE, CLOCK SYNCHRONIZATION METHOD, AND PROGRAM

(75) Inventors: Kazuo Takagi, Tokyo (JP); Hideo Yoshimi, Tokyo (JP)

(73) Assignee: NEC Corporation, Tokyo (JP)

( * ) Notice: Subject to any disclaimer, the term of this patent is extended or adjusted under 35 U.S.C. 154(b) by 961 days.

(21) Appl. No.: 12/919,635

(22) PCT Filed: Mar. 24, 2009

(86) PCT No.: PCT/JP2009/055845
§ 371 (c)(1),
(2), (4) Date: Sep. 21, 2010

(87) PCT Pub. No.: WO2009/119599
PCT Pub. Date: Oct. 1, 2009

(65) Prior Publication Data
US 2011/0006818 A1     Jan. 13, 2011

(30) Foreign Application Priority Data

Mar. 27, 2008  (JP) ................................. 2008-082937

(51) Int. Cl.
*H04J 3/06* (2006.01)
*H03L 7/085* (2006.01)
*H03L 7/18* (2006.01)

(52) U.S. Cl.
CPC ............... *H04J 3/0664* (2013.01); *H03L 7/085* (2013.01); *H03L 7/18* (2013.01)
USPC .......................................... 370/509; 370/503

(58) Field of Classification Search
USPC .................... 370/503, 509, 510, 512
See application file for complete search history.

(56) References Cited

U.S. PATENT DOCUMENTS 6,640,193 B2 * 10/2003 Kuyel ............................. 702/69
7,391,368 B1 * 6/2008 Gao et al. ...................... 342/387
(Continued)

FOREIGN PATENT DOCUMENTS

JP       5-37560 A     2/1993
JP       10-173522 A   6/1998
(Continued)

OTHER PUBLICATIONS

International Search Report for PCT/JP2009/055845 mailed Apr. 28, 2009.

*Primary Examiner* — Brandon Renner
*Assistant Examiner* — Scott M Sciacca
(74) *Attorney, Agent, or Firm* — Sughrue Mion, PLLC

(57) ABSTRACT

The invention provides a clock synchronization system which synchronizes the clock of a slave node with the clock of a master node by use of a timestamp packet transmitted from the master node to the slave node on the packet network, wherein the slave node includes a phase comparison part 201 which calculates a difference between a received timestamp and a timestamp generated on the slave node side; an LPF part 202 which suppresses jitters and noises contained in the difference obtained by the phase comparison part; a PI control part 203 which generates a control signal configured to ultimately reduce the difference to zero; a VCO part 204 which outputs a clock signal with a frequency corresponding to the generated control signal; a frequency division part 205 which generates a clock signal with a frequency up-converted from the frequency of the clock signal; a timestamp generation part 206 which outputs a timestamp based on the clock signal from the frequency division part; and a resolution conversion part 207 which increases the resolution of the timestamp from said timestamp generation part.

24 Claims, 12 Drawing Sheets

(56) References Cited

U.S. PATENT DOCUMENTS

| | | | |
|---|---|---|---|
| 7,626,462 B1* | 12/2009 | Hietala et al. | 331/2 |
| 2003/0227342 A1* | 12/2003 | Liu | 332/145 |
| 2004/0062278 A1* | 4/2004 | Hadzic et al. | 370/503 |
| 2005/0237434 A1* | 10/2005 | Takatori et al. | 348/725 |
| 2006/0176846 A1* | 8/2006 | Miki et al. | 370/328 |
| 2006/0242445 A1* | 10/2006 | Aweya et al. | 713/400 |
| 2008/0019398 A1* | 1/2008 | Genossar et al. | 370/498 |
| 2009/0225743 A1* | 9/2009 | Nicholls et al. | 370/350 |
| 2011/0156820 A1* | 6/2011 | Travis | 331/18 |

FOREIGN PATENT DOCUMENTS

| | | |
|---|---|---|
| JP | 2000244473 A | 9/2000 |
| JP | 2001244809 A | 9/2001 |
| JP | 2003258894 A | 9/2003 |

* cited by examiner

CLOCK SYNCHRONIZATION SYSTEM, NODE, CLOCK SYNCHRONIZATION METHOD, AND PROGRAM

INCORPORATION BY REFERENCE

This application is the National Phase of PCT/JP2009/055845, filed Mar. 24 2009, which is based upon and claims the benefit of priority from Japanese patent application No. 2008-082937, filed on Mar. 27, 2008, the disclosure of which is incorporated herein in its entirety by reference.

TECHNICAL FIELD

The present invention relates a clock synchronization system, node, clock synchronization method, and program for achieving clock synchronization among devices over a packet network, and more particularly to a clock synchronization system, node, clock synchronization method, and program for compensating a clock offset between a master node and a slave node within a packet network.

BACKGROUND ART

Communication common carriers are actively promoting the building of high-speed data communication networks with a view to realize higher value-added services.

A high-speed data communication network requires a large traffic capacity. For such a network, an Internet Protocol (IP) approach is more suitable than a time-division multiplex approach because the former is sufficiently efficient and is less costly than the latter.

However, once a network shifts to an IP approach, it becomes essential for some applications to communicate highly accurate clock information to devices that are connected to the packet network.

For example, in order to achieve high-quality exchange of real-time audio and/or video data between a transmitter and receiver, the data must be reproduced at pre-determined timings. This requirement cannot be met without a stable clock.

In a mobile network as well, an accurate clock is essential in order to reliably achieve inter-cell handover.

More specifically, base stations within a mobile network are required to synchronize among one another at an accuracy of 50 ppb (parts per billion). If the clock in a base station drifts beyond this limit, an inter-cell handover in which the base station is involved would fail, very often resulting in packet losses and/or deteriorated communication quality.

Thus, in order to achieve a stable service quality, a method is necessary that can communicate accurate clock information over a packet network. One technology that is effective in solving the above-described problem is the timestamp approach. A timestamp mechanism is easy to implement and can achieve a high level of clock synchronization accuracy.

FIG. 14 shows an example system structure based on the timestamp approach described above. In the timestamp approach, clock synchronization is ensured by causing the master node to transmit a timestamped packet to the slave node and the slave node to adjust its clock according to the timestamp.

More specifically, a timestamp is used to generate a control signal for a phase synchronization loop (PLL). The PLL achieves clock synchronization by calculating a difference between its clock and the timestamp that has newly arrived and adjusting its clock based on the difference.

The PLL circuit 300 shown in FIG. 14 primarily consists of six different functions. These functions are a phase comparison part 301, loop filter (LPF) part 302, a proportion/integral (PI) control part 303, a voltage control oscillation part (VCO) 304, a frequency division part 305, and a timestamp generation part 306.

The phase comparison part 301 calculates a differential signal between the received timestamp and the timestamp generated by the slave node. The differential signal is inputted into the LPF part 302 to suppress the jitters and noises therein.

The PI control part 303 outputs to the VCO part 304 a control signal configured to ultimately reduce the differential signal to zero.

The VCO part 304 outputs a clock with a frequency to be determined by the control signal from the PI control part 303.

The frequency division part 305 generates an up-converted or down-converted clock by converting the frequency received from the VCO part 304.

The timestamp generation part 306 outputs a timestamp based on the received clock.

Arts based on the above-described timestamp approach are disclosed in, for example, Patent Literature 1 and Patent Literature 2.

Patent Literature 1: Japanese Patent Laying-Open No. Hei 05-37560.
Patent Literature 2: Japanese Patent Laying-Open No. 2003-258894.

A clock synchronous state as used herein is a state in which the timing of the received timestamp 400 completely matches that of the timestamp 401 generated by the slave, node, as shown in FIG. 15(A).

On the other hand, in a state in which the two clocks are not synchronous (i.e., an "asynchronous state"), as shown in FIG. 16(B), there exists a deviation in timing between the timestamp 400 and the timestamp 401.

In order to achieve highly accurate clock synchronization, it is necessary to quickly detect such a deviation and correct the clock timing. However, a deviation may not easily be detected, depending on the way the two timestamps deviate from each other.

FIG. 16 shows an example of such a situation. First, a case where the clock frequency on the slave node side is lower than that on the master node side will be considered.

The timestamp on the slave node side, which is represented by the pattern in the middle line in FIG. 16, is progressing more slowly than that on the master node side. The deviation between the timestamps of the master and slave nodes can be detected by checking the second timestamp.

Next, a case where the slave-node clock frequency is higher than the master-node clock frequency will be considered.

The slave-node timestamp, which is represented by the pattern in the lower line in FIG. 16, is progressing faster than the master-node timestamp. In this case, the deviation between the timestamps of the master and slave nodes cannot be detected until the eighth timestamp is reached.

In situations like the latter case, clock synchronization accuracy deteriorates because a deviation between timestamps cannot be detected quickly and it therefore takes a longer time to correct clock frequency.

EXEMPLARY OBJECT OF INVENTION

The invention was made to solve the above-described problem and its object is to provide a clock synchronization system, node, clock synchronization method, and program that

SUMMARY

According to a first exemplary aspect of the invention, a clock synchronization system which synchronizes the clock of a slave node with the clock of a master node by use of a timestamp packet transmitted from the master node to the slave node, wherein the slave node includes a phase comparison unit which calculates a difference between a received timestamp and a timestamp generated on the slave node side, a unit which suppresses jitters and noises contained in the difference obtained by the phase comparison unit, a control unit which generates a control signal configured to ultimately reduce the difference to zero, a clock output unit which outputs a clock signal with a frequency corresponding to the generated control signal, a frequency division unit which generates a clock signal with a frequency up-converted from the frequency of the clock signal, a timestamp generation unit which outputs a timestamp based on the clock signal from the frequency division unit, and a resolution conversion unit which increases the resolution of the timestamp from the timestamp generation unit.

According to a second exemplary aspect of the invention, a node which synchronizes its clock with the clock of the master node by use of a timestamp packet transmitted from the master node within a packet network, includes a phase comparison unit which calculates a difference between a received timestamp and a timestamp generated on the node side, a unit which suppresses jitters and noises contained in the difference obtained by the phase comparison unit, a control unit which generates a control signal configured to ultimately reduce the difference to zero, a clock output unit which outputs a clock signal with a frequency corresponding to the generated control signal, a frequency division unit which generates a clock signal with a frequency up-converted from the frequency of the clock signal, a timestamp generation unit which outputs a timestamp based on the clock signal from the frequency division unit, and a resolution conversion unit which increases the resolution of the timestamp from the timestamp generation unit.

According to a third exemplary aspect of the invention, a clock synchronization method which synchronizes the clock of a slave node with the clock of a master node by use of a timestamp packet transmitted from the master node to the slave node, includes at the slave node, a phase comparison step of calculating a difference between a received timestamp and a timestamp generated on the slave node side, a step of suppressing jitters and noises contained in the difference obtained by the phase comparison step, a step of generating a control signal configured to ultimately reduce the difference to zero, a clock output step of outputting a clock signal with a frequency corresponding to the generated control signal, a frequency division step of generating a clock signal with a frequency up-converted from the frequency of the clock signal, a timestamp generation step of outputting a timestamp based on the clock signal from the frequency division step, and a resolution conversion step of increasing the resolution of the timestamp from the timestamp generation step.

According to a fourth exemplary aspect of the invention, a clock synchronization program which synchronizes the clock of a slave node with the clock of a master node by use of a timestamp packet transmitted from the master node to the slave node, wherein the clock synchronization program causing the slave node to perform a phase comparison process which calculates a difference between a received timestamp and a timestamp generated on the slave node side, a process which suppresses jitters and noises contained in the difference obtained by the phase comparison process, a process which generates a control signal configured to ultimately reduce the difference to zero, a clock output process which outputs a clock signal with a frequency corresponding to the generated control signal, a frequency division process which generates a clock signal with a frequency up-converted from the frequency of the clock signal, a timestamp generation process which outputs a timestamp based on the clock signal from the frequency division process, and a resolution conversion process which increases the resolution of the timestamp received from the timestamp generation process.

According to the invention, by increasing the resolution of timestamps to be reproduced by a slave node, it becomes possible to improve detection time and accuracy when a deviation occurs between the received time stamp and the reproduced time stamp and to adjust the clock frequency more quickly and accurately.

EXEMPLARY EMBODIMENT (First Exemplary Embodiment)

Figure 1:
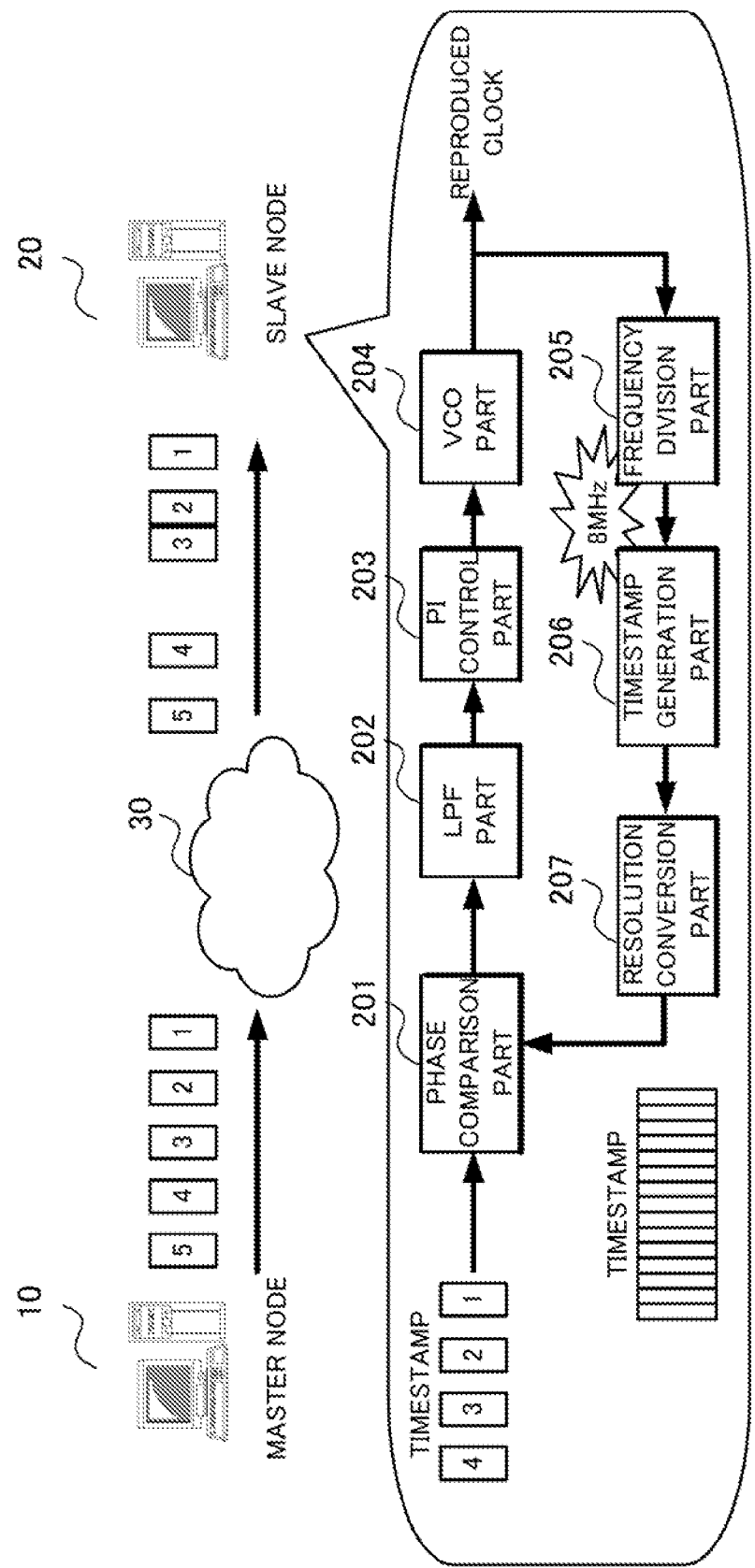
FIG. 1 is a block diagram showing the structures of a clock synchronization system and its slave node according to a first exemplary embodiment of the invention.

The first exemplary embodiment to implement the invention will be described in detail below by referring to the drawings.

(Structure)

With reference to FIG. 1, the system according to the first exemplary embodiment of the invention includes a packet network 30, a master node 10 and a slave node 20.

(Regarding the Master Node 10)

The master node 10 periodically transmits to the slave node 20 a packet with a timestamp for clock synchronization. The timestamp is generated based on the clock of the master node 10 and its value is incremented, for example, by one for each packet.

(Regarding the Slave Node 20)

The slave node 20, as shown in the figure, includes a phase comparison part 201, an LPF part 202, a PI control part 203, a VCO part 204, a frequency division part 205, a timestamp generation part 206, and a resolution conversion part 207.

The slave node 20 receives a timestamped packet from the master node 10.

The timestamp in the received packet is sent to the phase comparison part 201.

The phase comparison part 201 calculates a timing error, which is a deviation (difference) between the timestamp in the received packet and the timestamp reproduced by the slave node 20, generates a differential signal, and transmits the differential signal to the LPF part 202.

The LPF part 202 performs the process of suppressing jitters and noises contained in the received differential signal, and sends the differential signal in which the jitters and noises have been suppressed to the PI control part 203.

The PI control part 203 converts the signal from the LPF part 202 in which the jitters and noises have been suppressed, into a control signal configured to ultimately reduce the differential signal to zero.

The control signal is sent to the VCO part 204, which in turn outputs a clock signal with a frequency corresponding to the size of the control signal.

The frequency division part 205 generates a clock signal by up-converting the clock signal from the VCO part 204 to a higher frequency.

The frequency division part that is commonly used in related arts uses a down-converted frequency as the frequency of a transmit timestamp. For example, if the frequency of the transmit timestamp is 8 kHz, the frequency of 8 kHz used by the frequency division part is the result of down-converting the original frequency.

In contrast, the frequency division part 205 of this exemplary embodiment up-converts the signal to a higher frequency in order to increase the resolution of the timestamp. For example, if a 1000 times higher resolution is to be achieved, the signal will be up-converted to a frequency of 8 MHz, which is 1000 times higher than 8 kHz.

The timestamp generation part 206 receives the clock signal down-converted by the frequency division part 205 and outputs a timestamp based on the clock signal.

The resolution conversion part 207 performs the conversion process on the timestamp to increase its resolution and outputs the resultant timestamp with an increased resolution.

Figure 2:
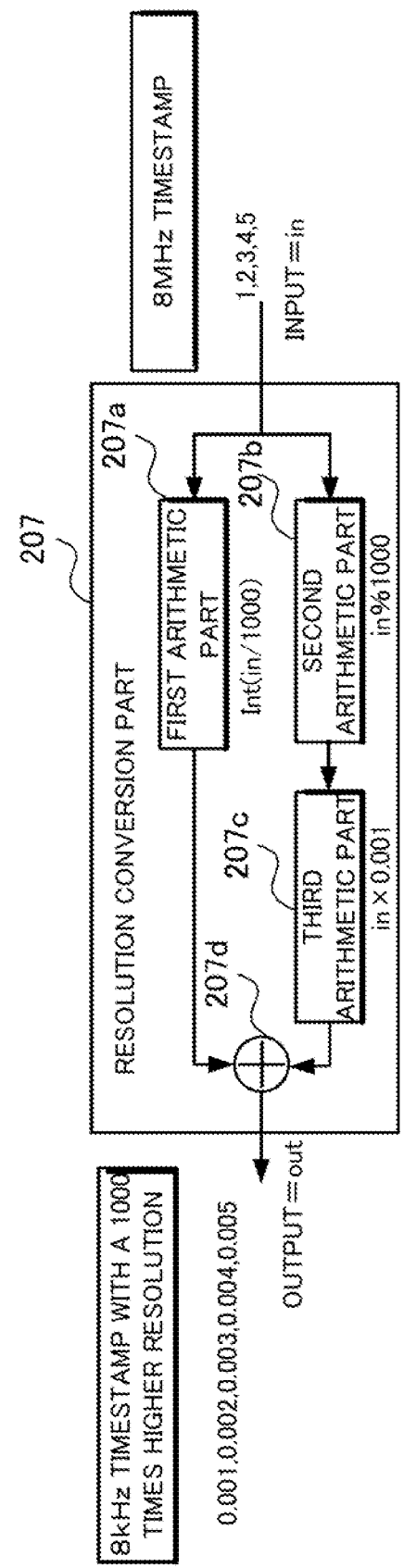
FIG. 2 is a block diagram showing the structure of the resolution conversion part of the slave node according to the first exemplary embodiment of the invention.

FIG. 2 shows an example structure of the resolution conversion part 207, which generates from an 8 MHz timestamp an 8 kHz timestamp by increasing the resolution by 1000 times.

Referring to FIG. 2, the resolution conversion part 207 comprises a first arithmetic part 207a, a second arithmetic part 207b, a third arithmetic part 207c, and an adder 207d.

The first arithmetic part 207a obtains a quotient by dividing the value of the timestamp from the timestamp generation part 206 by a magnification coefficient that represents the extent to which the resolution of the timestamp will be increased.

The second arithmetic part 207b and the third arithmetic part 207c obtain a value by further dividing the remainder of dividing the timestamp value by the magnification coefficient, again by the same magnification coefficient.

The adder 207d adds the arithmetic result (quotient) obtained by the first arithmetic part 207a to the arithmetic result obtained by the second arithmetic part 207b and the third arithmetic part 207c, and outputs the resultant value.

An example of the resolution conversion process performed by the timestamp generation part 206 when it receives an 8 MHz timestamp from the resolution conversion part 207 will be described below.

The resolution conversion part 207, after dividing the received timestamp into two branches, causes the first arithmetic part 207a to perform an arithmetic operation "Int(in/1000)" in order to obtain a quotient by dividing the timestamp value by the magnification coefficient "1000" by which the timestamp resolution should be increased.

The resolution conversion part 207 further causes the second arithmetic part 207b to perform an arithmetic operation "in % 1000" in order to obtain a remainder of dividing the timestamp value by the magnification coefficient "1000" and then the third arithmetic part 207c to perform an arithmetic operation "in ×0.001" (i.e. multiply by 0.001).

By adding these two arithmetic results by unit of the adder 207d, a timestamp with a 1000 times higher resolution, i.e. 8 kHz, can be generated.

(Operation According to First Exemplary Embodiment)

Next, the operation of the first exemplary embodiment of the present invention will be described.

The first exemplary embodiment is primarily based on the well-known phase synchronization loop (PLL). The operation of its elements, including the phase comparison part 201, the LPF part 202, the PI control part 203, the VCO part 204, the frequency division part 205, and the timestamp generation part 206, is the same as the operation of the well-known elements of related arts.

However, unlike these related arts, the first exemplary embodiment of the invention increases the resolution of the timestamp on the salve node 20 side for faster detection of a deviation in timing between two timestamps.

In order to increase the resolution of the timestamp, the frequency division part 205 and the resolution conversion part 207 of the first exemplary embodiment operate as described below.

First, in order to facilitate the increase of the resolution of the timestamp, the frequency division part 205 up-converts the clock frequency of the VCO part 204 to a higher frequency. The resolution conversion part 207 then performs the conversion process on the timestamp to increase its resolution as shown in FIG. 2 and outputs the timestamp with the increased resolution.

Figure 3:
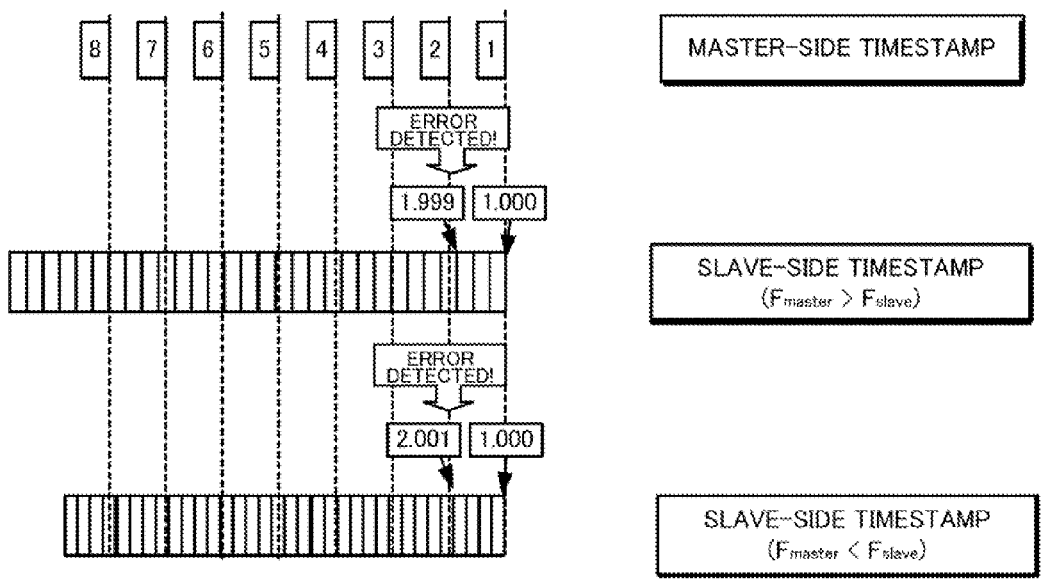
FIG. 3 is a diagram for explaining synchronization accuracy when timestamp resolution is increased.

FIG. 3 shows an example where the timestamp resolution has been increased.

First, a case where the clock frequency on the slave node side 20 is lower than that on the master node side 10 will be considered.

The timestamp on the slave node 20 side, which is represented by the pattern in the middle line in FIG. 3, is progressing more slowly than that on the master node 10 side.

In this case, similarly to the related arts, the deviation between the time stamps Of the master node 10 and the slave node 20 can be detected by checking the second time stamp. In addition, because of the increased resolution of the timestamp, the amount of deviation between the timestamps can be determined accurately.

In the example shown in FIG. 3, at the time when the second timestamp is received from the transmitting side, the reproduced timestamp still remains at 1.999 and therefore a deviation of 0.001 (delay) is detected.

Next, a case where the clock frequency on the slave node 20 side is higher than the clock frequency of the master node 10 side will be considered.

The timestamp on the slave node 20 side, which is represented by the pattern in the lower line in FIG. 3, is progressing faster than that on the master node 10 side.

In such a situation, the approach taken by the related arts is unable to detect a timestamp deviation until the eighth timestamp arrives.

In contrast, the first exemplary embodiment of the invention can detect a deviation upon the arrival of the second timestamp because its timestamp resolution has been increased.

In this example, at the time when the timestamp (2) is received from the transmitting side, the reproduced timestamp has already moved to 2.001 and therefore a deviation of 0.001 (advancement) is detected.

By using a timestamp with a higher resolution as described above, it becomes possible to detect a deviation in timestamps immediately upon the occurrence thereof, and consequently synchronization accuracy can be improved.

Figure 4:
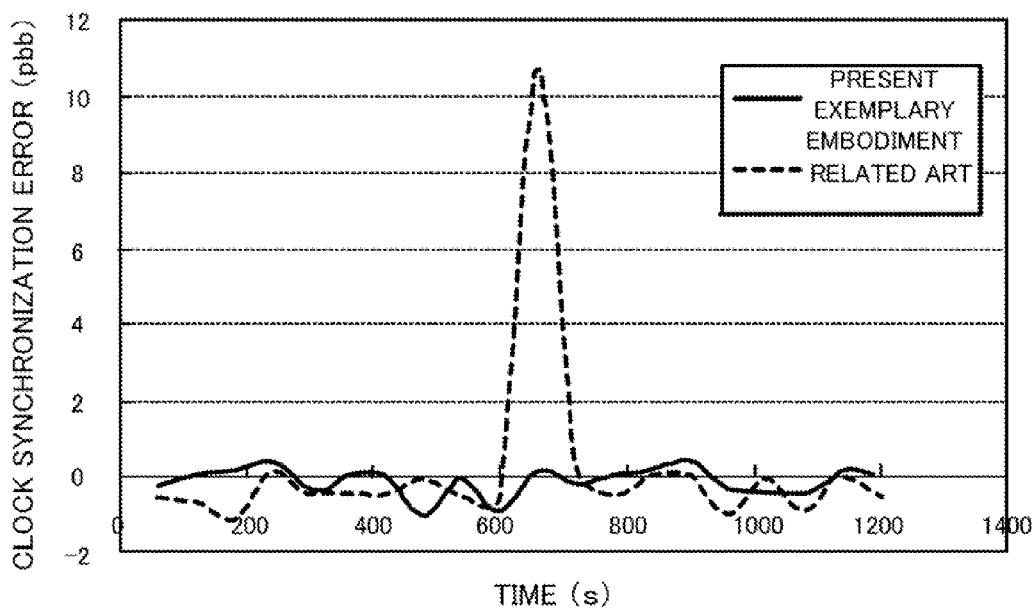
FIG. 4 is a diagram showing the results of an experiment conducted to evaluate the effectiveness of the first exemplary embodiment.

FIG. 4 is a diagram showing results of an experiment conducted to evaluate the effectiveness of the first exemplary embodiment.

FIG. 4 compares clock synchronization errors between when the approach of the related arts, to which the present invention is not applied, is used and when the approach of the first exemplary embodiment of the invention is used.

As seen from FIG. 4, the results for the conventional approach of the related arts include points in time when a clock synchronization error exceeded 10 ppb (parts per billion).

In contrast, the results for the first exemplary embodiment indicate that clock synchronization accuracy was consistently stable because synchronization errors were effectively suppressed.

Therefore, if the resolution of timestamps is increased by this exemplary embodiment, the time required for the detection of a deviation in timestamps is reduced and the clock frequency can consequently be adjusted more quickly. This leads to the minimization of the period during which a clock frequency deviation is occurring, and eventually to the realization of highly accurate clock synchronization.

(Effects of First Exemplary Embodiment)

Next, the effects of the first exemplary embodiment of the present invention will be described.

In the first exemplary embodiment, the clock frequency can be adjusted more quickly, because the time required for the detection of a deviation in timestamps can be remarkably reduced by increasing the resolution of timestamps. This leads to the minimization of the period during which a clock frequency deviation is occurring, and eventually to the realization of highly accurate clock synchronization.

(Second Exemplary Embodiment)

The second exemplary embodiment of the invention will now be described in detail with reference to the drawings.

(Structure)

Figure 5:
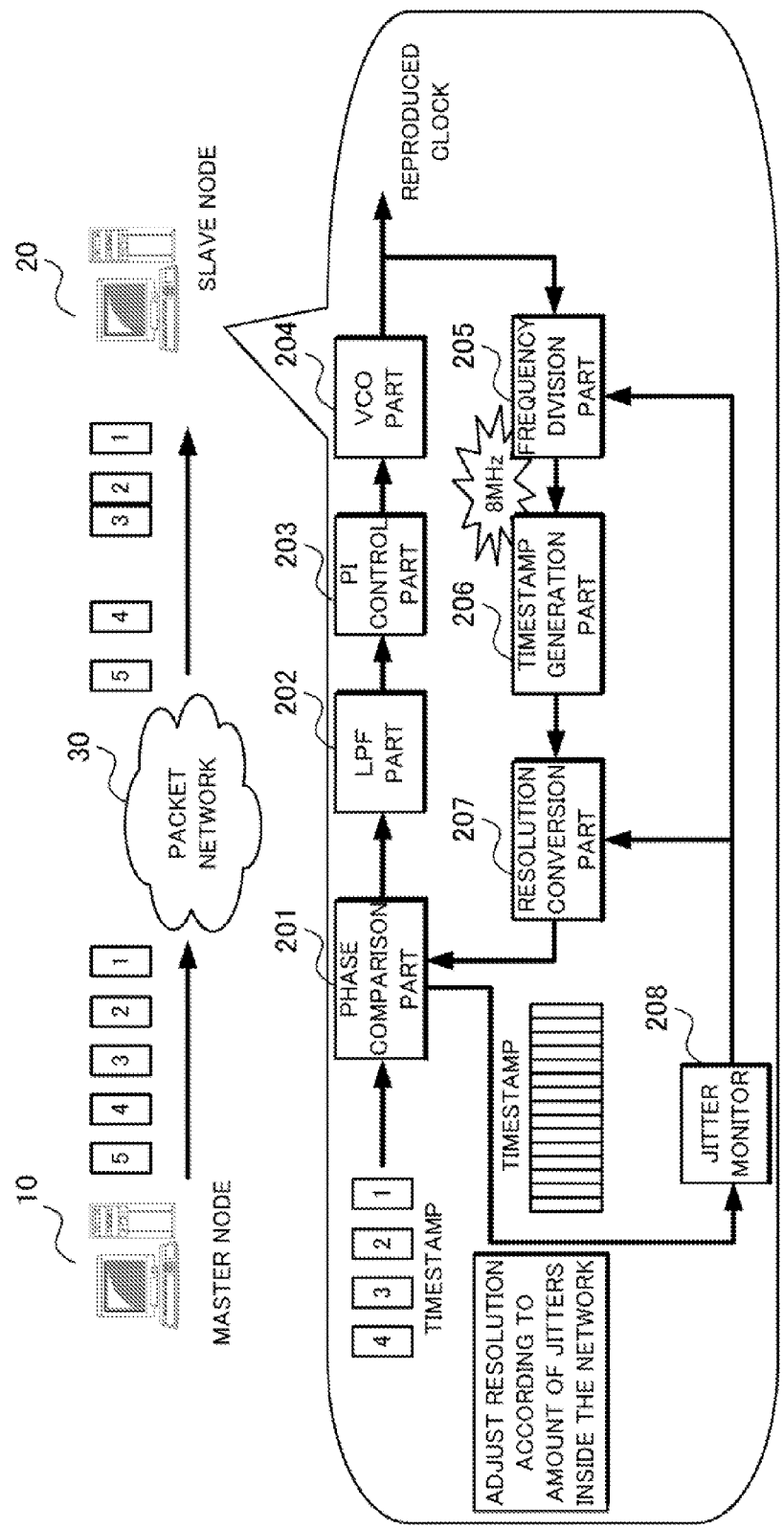
FIG. 5 is a block diagram showing the structures of a clock synchronization system and its slave node according to a second exemplary embodiment of the invention.

With reference to FIG. 5, the second exemplary embodiment of the invention includes a packet network 30, a master node 10 and a slave node 20, similarly to the first exemplary embodiment.

(Regarding the Master Node 10)

The master node 10 periodically transmits to the slave node 20 a packet with a timestamp for clock synchronization.

(Regarding the Slave Node 20)

The slave node 20, similarly to FIG. 1, includes a phase comparison part 201, an LPF part 202, a PI control part 203, a VCO part 204, a frequency division part 205, a timestamp generation part 206, and a resolution conversion part 207.

The slave node 20 of the second exemplary embodiment differs from that of the first exemplary embodiment in that the former also includes a jitter monitor 208.

The jitter monitor 208 measures the amount of delay jitters inside a network, based on the time of arrival for the received timestamp.

The jitter monitor 208 has a function to adjust the frequency division ratio of the frequency division part 205 and the resolution of the resolution conversion part 207, based on the measured amount of delay jitters.

The operation of the phase comparison part 201, the LPF part 202, the PI control part 203, the VCO part 204, the frequency division part 205, the timestamp generation part 206, and the resolution conversion part 207 of the slave node 20 is the same as the first exemplary embodiment, and thus will be omitted from the description below.

(Operation According to Second Exemplary Embodiment)

Next, the operation according to the second exemplary embodiment of the present invention will be described.

The second exemplary embodiment of the invention can achieve accurate clock synchronization while preventing the deterioration of accuracy due to delay jitters, by adjusting the resolution of a timestamp according to the amount of delay jitters inside a network.

Figure 6:
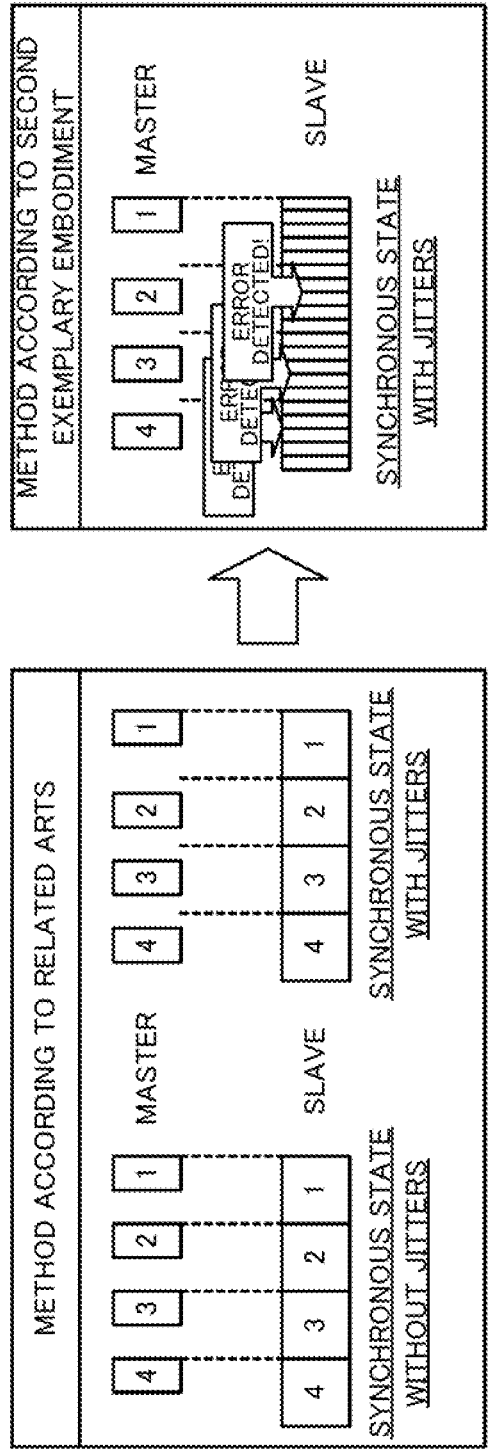
FIG. 6 is a diagram showing the different states of a timestamp depending on with or without delay jitters.

FIG. 6 shows a timestamp under the influence of delay jitters. The description below assumes that clock synchronization has already been established.

The left side of FIG. 6 shows timestamps as used by related arts. When there are no delay jitters, the received timestamps and their corresponding reproduced timestamp exactly match each other in timing (synchronous state without jitters). When there are delay jitters (synchronous state with jitters), on the other hand, the received timestamps deviate in timing from their corresponding timestamps.

However, where the amount of the deviation of each received timestamp is less than one timestamp interval, as shown in FIG. 6, no errors are detected even when the received timestamps are compared with their corresponding reproduced timestamps. This is because the resolution of the reproduced timestamps is too low to detect the deviations in timing due to delay jitters.

As described above, where the amount of delay jitters does not exceed one timestamp interval, the approach based on the related arts is not affected by delay jitters because no timing deviations are detected.

The right side of FIG. 6 shows the same timestamps as the left side, except that the resolution of the reproduced timestamps has been increased by using the method according to the first exemplary embodiment described above.

In this case, if the timings of the received timestamps deviate from their corresponding timestamps due to the influence of delay jitters, timing deviations are detected according to the amount of delay jitters. For example, if a resolution is increased to be 100 times higher, even delay jitters as trivial as 1/100 of a timestamp interval would cause a timing deviation.

Thus, an increased resolution of the reproduced timestamps makes them overly sensitive to delay jitters, causing the accuracy of clock synchronization to be deteriorated.

Figure 7:
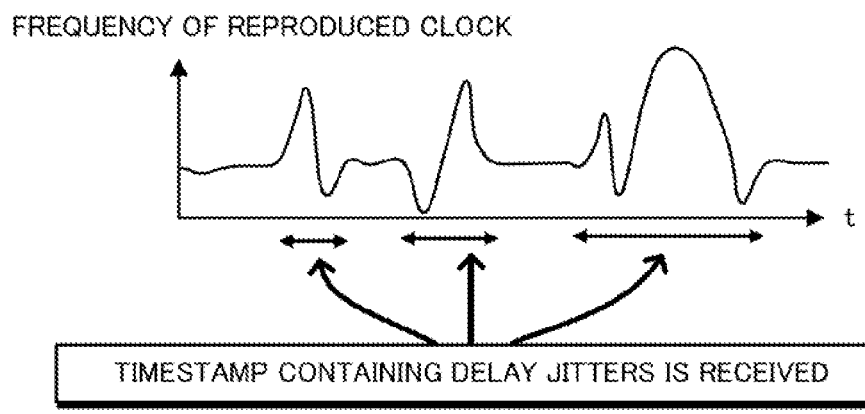
FIG. 7 is a diagram showing how synchronization accuracy deteriorates under the influence of delay jitters.

FIG. 7 shows how synchronization accuracy deteriorates under the influence of delay jitters.

As shown in this figure, when a packet with a delay jitter arrives, synchronization accuracy temporarily deteriorates because the clock is erroneously corrected. Therefore, if the resolution of reproduced timestamps is increased, the problem occurs that synchronization accuracy deteriorates due to the influence of delay jitters.

Figure 8:
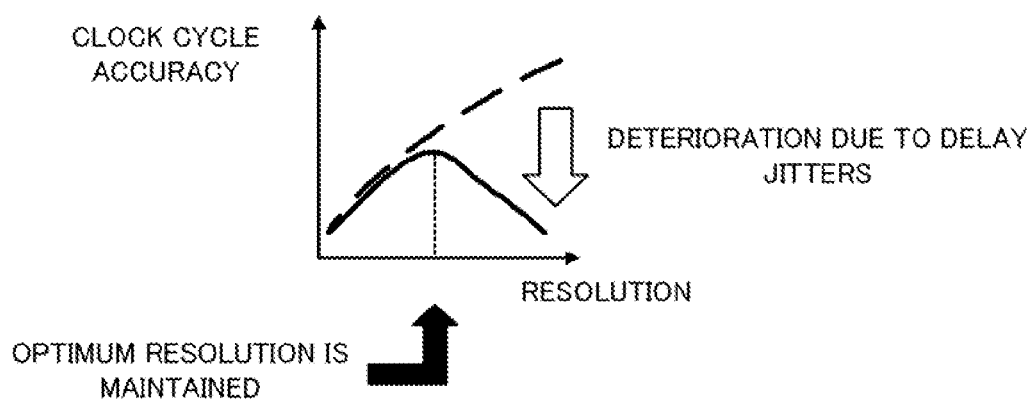
FIG. 8 is a diagram showing the relationship between timestamp resolution and clock synchronization accuracy.

FIG. 8 shows the relationship between timestamp resolution and clock synchronization accuracy.

In the absence of delay jitters, clock synchronization accuracy improves as a function of the level of resolution (as shown by the dotted line in FIG. 8). The improvement of synchronization accuracy occurs because a higher resolution results in quicker detection of clock deviations as described in the first exemplary embodiment.

The solid line in FIG. 8 represents a graph where delay jitters exist. In this case, if the resolution is increased excessively, synchronization accuracy will deteriorate rather than improving, because timestamps become overly sensitive to delay jitters.

It should be noted, however, that there exists an optimum level of resolution, where the resolution of the timestamp can be increased and yet the best synchronization accuracy can be achieved while suppressing the influence of delay jitters to the minimum.

The second exemplary embodiment of the invention enables the best clock synchronization accuracy to be achieved in any possible situations by identifying such optimum level of resolution.

The second exemplary embodiment is structurally characteristic in that it monitors delay jitters and controls the resolution based on the results of such monitoring.

In order to monitor delay jitters, the second exemplary embodiment uses the jitter monitor 208 to measure deviations for received timestamps. These deviations for received timestamps can be measured from output signals from the phase comparison part 201.

Figure 9:
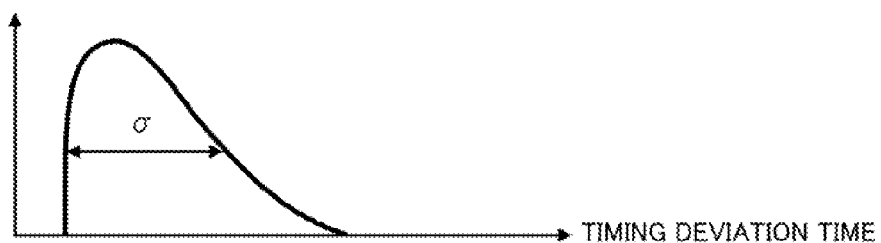
FIG. 9 is a diagram illustrating the probability of the occurrence of deviations between timestamps.

FIG. 9 illustrates the probability of the occurrence of a timestamp deviation. A timestamp deviation has a shape like a half normal distribution, as shown in FIG. 9. Here, the range over which the area of this shape is reduced to a half is assumed to be the variance (σ) of delay jitters.

Figure 10:
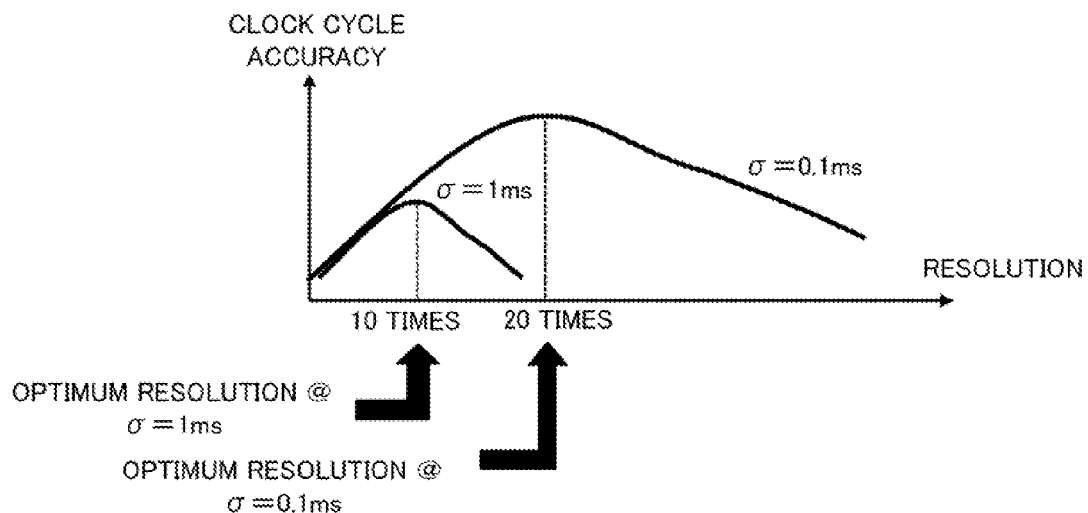
FIG. 10 is a diagram showing an example of the relationship between resolution and clock synchronization accuracy, based on the use of the variance as a parameter.

FIG. 10 shows the relationship between timestamp resolution and clock synchronization, based on the use of the variance σ as a parameter. The shape of the graph changes with the delay jitter variance σ as a parameter.

The graph in FIG. 10 indicates that a resolution of 10 times is optimum where the amount of delay jitter is large, for example, σ=1 ms.

On the other hand, the graph indicates that a resolution of 20 times is optimum where the amount of delay jitter is small, for example, σ=0.1 ms.

Based on a characteristic curve, as shown in FIG. 10, that was obtained in advance through an experiment or other unit, the jitter monitor 209 according to this exemplary embodiment contains pre-set data that indicate the relationship between resolution and clock synchronization accuracy with the variance of delay jitters as a parameter.

Based on the measured delay jitter variance σ, the jitter monitor 208 can obtain an optimum level of resolution at which the clock synchronization accuracy will be maximum, from the pre-set relationship between resolution and clock synchronization accuracy. In addition, it can instruct the frequency division part 205 and the resolution conversion part 207 to adjust the timestamp resolution to the optimum resolution thus obtained.

For example, if a 10 times higher resolution needs to be set, the jitter monitor 208 instructs the frequency division part 205 to up-convert a clock signal to a frequency 10 times higher than the transmit timestamp and output the resultant clock signal.

Figure 11:
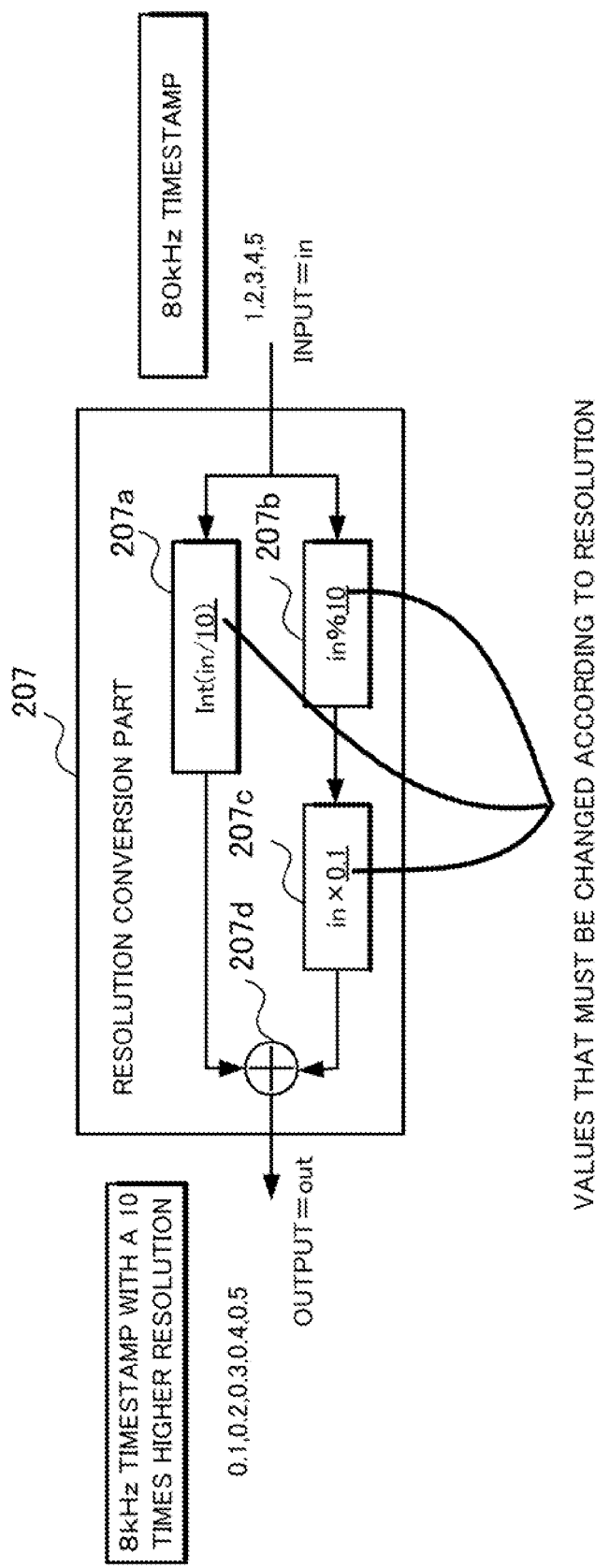
FIG. 11 is a diagram showing an example of setting an instruction for the resolution conversion part to output a timestamp with 10 times higher resolution.

To the resolution conversion part 207, the jitter monitor 208 issues an instruction to output a timestamp with a 10 times higher resolution. More specifically, as shown in FIG. 11, the jitter monitor 208 sets a magnification coefficient "10," which indicates the extent by which the resolution should be increased, in the first arithmetic part 207a and the second arithmetic part 207b of the resolution conversion part 207, and sets the inverse number of the magnification coefficient (1/10=0.1) in the third arithmetic part 207c of the resolution conversion part 207.

Figure 12:
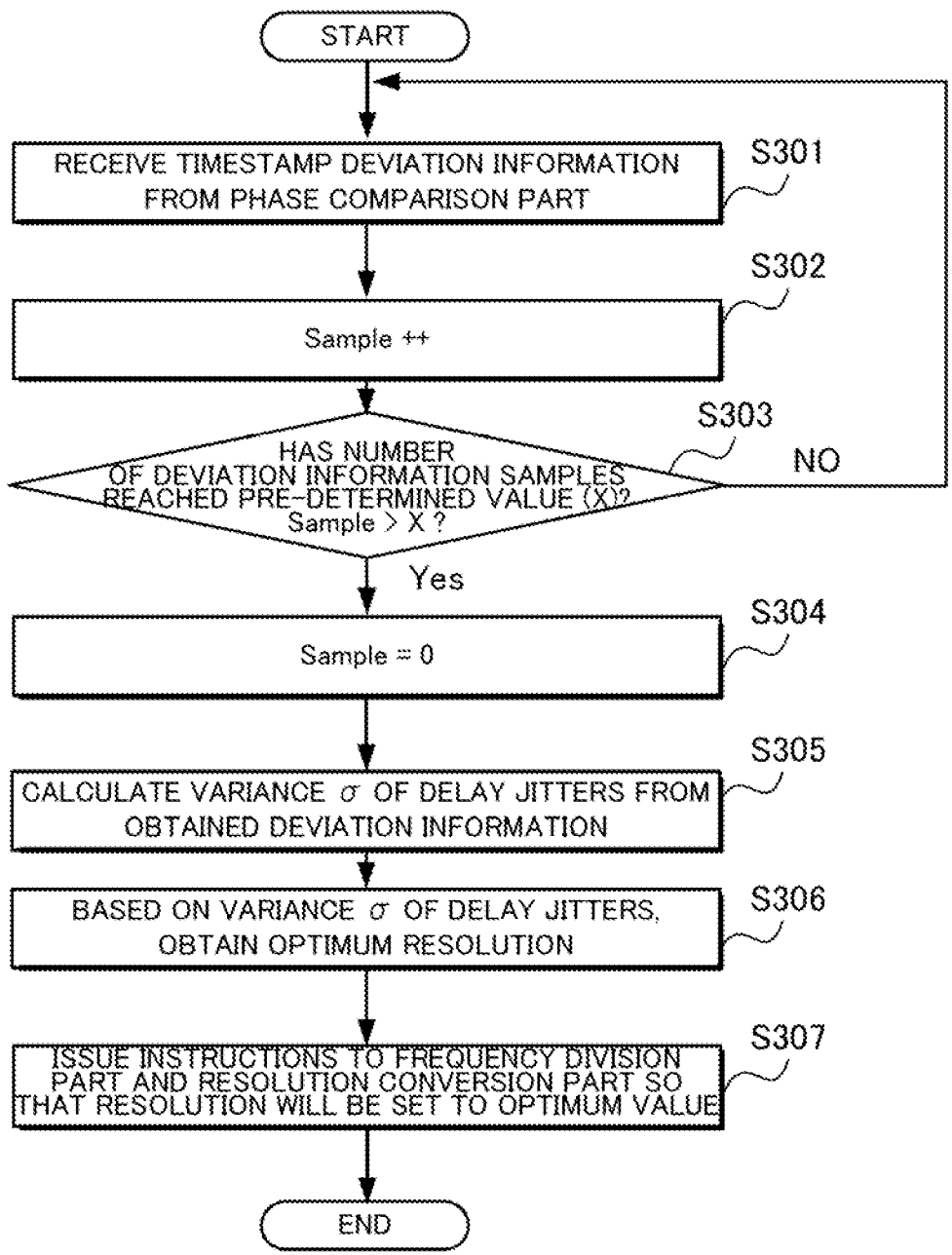
FIG. 12 is a flow chart illustrating the operation of the jitter monitor according to the second exemplary embodiment.

The operation of the jitter monitor 208 according to this exemplary embodiment will be described with reference to the flow chart in FIG. 12.

Every time the jitter monitor 208 receives timestamp deviation information from the phase comparison part 201 (step S301), it increments the number of samples that corresponds to such deviation information (step S302).

The jitter monitor 208 then determines whether or not the number of samples of the deviation information has reached the pre-determined value (X) (step S303). If the pre-determined value (X) has not been reached, it continues to receive deviation information.

If the pre-determined value (X) has been reached, the jitter monitor 208 initializes the number of samples corresponding to the deviation information (step S304), and calculates a delay jitter variance a from the received deviation information (step S305).

Then, based on the calculated delay jitter variance σ, the jitter monitor 208 obtains from the pre-set relationship between resolution and clock synchronization accuracy an optimum resolution at which clock synchronization accuracy will be maximum (step S306).

Following this, the jitter monitor 208 instructs frequency division part 205 and the resolution conversion part 207 to adjust the resolution of the timestamp to the optimum resolution thus obtained (step S307).

By identifying an optimum resolution according to the amount of delay jitters, it becomes possible to achieve the best clock synchronization accuracy in any possible situations.

(Effects of Second Exemplary Embodiment)

The effects of the second exemplary embodiment of the invention will be described below.

The second exemplary embodiment can adjust a clock frequency promptly while preventing the influence of delay jitters, by measuring the amount of delay jitters and adjusting the resolution of a timestamp according to the measured amount of delay jitters inside a network. By this, the object of the invention to achieve highly accurate clock synchronization can be realized.

An example hardware structure of the above-described slave node 20 will now be described with reference to FIG. 13.

Figure 13:
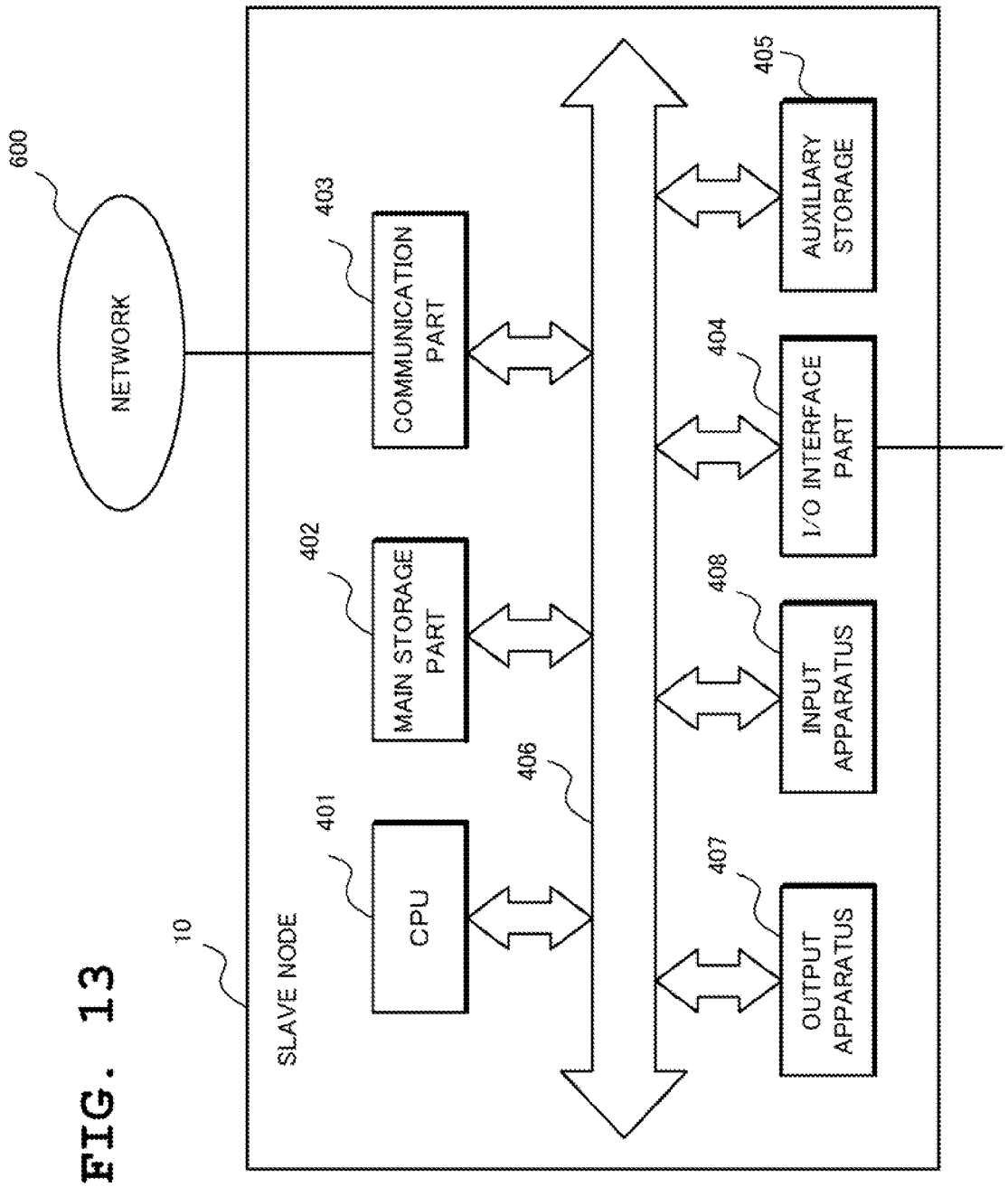
FIG. 13 is a block diagram showing an example hardware structure for a slave node according to an exemplary embodiment of the invention.
Figure 14:
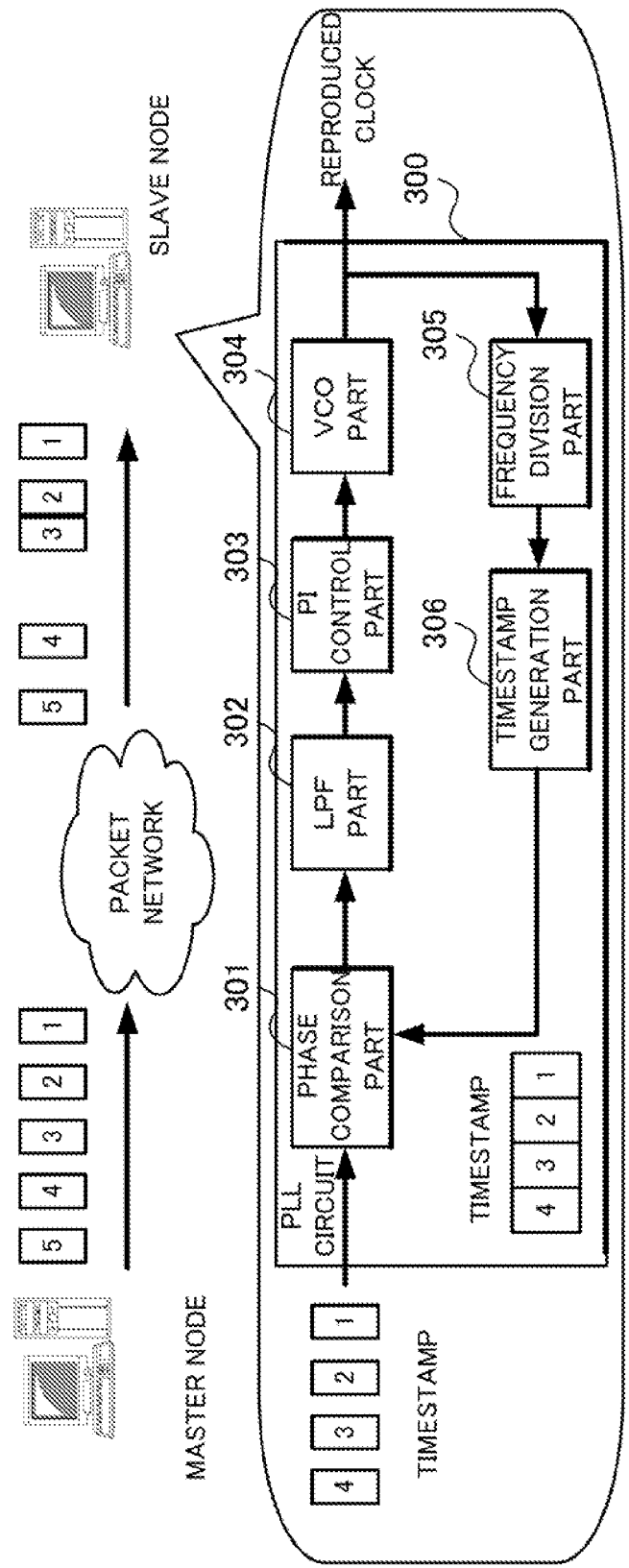
FIG. 14 is a block diagram showing an example of the structure of a related art based on the timestamp approach.
Figure 15:
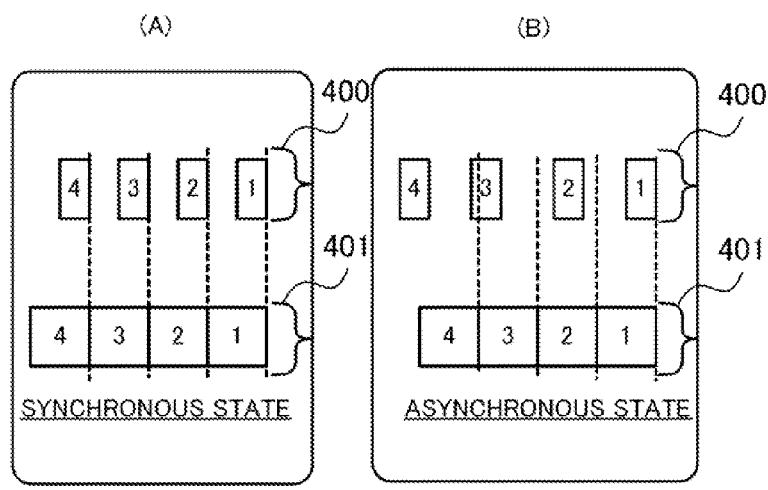
FIG. 15 is a diagram illustrating a clock synchronous state and a clock asynchronous state.
Figure 16:
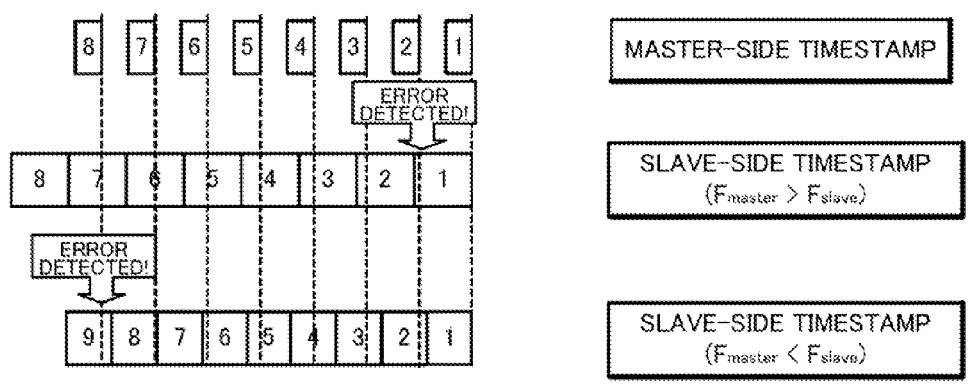
FIG. 16 is a diagram showing how a deviation between timestamps is detected.

As shown in FIG. 13, the slave node 20 may be realized in any hardware structure similar to general computer devices, and comprises a CPU (Central Processing Unit) 401; a main storage part 402, which consists of a RAM (Random Access Memory) and other main memories and which is used as data workspace and temporary save space for data; a communication part 403, which transmits and receives data via the network 600; an input/output interface part 404, which is connected with an external device to perform transmission/receipt of data; an auxiliary storage part 405, which is a hard disc devise consisting of a nonvolatile memory, such as a ROM (Read Only Memory), magnetic disc and semiconductor memory; a system bus 406, which connects between the above-mentioned components of this information processing apparatus; an output device 407, such as a display device; and an input device 408, such as a keyboard.

It goes without saying that the operation of the slave node 20 according to this exemplary embodiment can be realized as hardware by implementing a circuit component, which is a hardware component, such as an LSI (Large Scale Integration), incorporating a clock synchronization program that performs clock synchronization based on the timestamp approach. It can also be realized as software by storing in the auxiliary storage part 405 a clock synchronization program that provides the functions of the phase comparison part 201, the LPF part 202, the PI control part 203, the VCO part 204, the frequency division part 205, the timestamp generation part 206, the resolution conversion part 207, and the jitter monitoring part 208, loading the program into the main memory 402, and executing the program on the CPU 401.

While the present invention has been described by taking a preferred exemplary embodiment and examples, it should be appreciated that the invention is not limited to such exemplary embodiment and examples but can be embodied with a variety of modifications without departing from the spirit and scope of its technical principle.

INCORPORATION BY REFERENCE

This application is based upon and claims the benefit of priority from Japanese patent application No. 2008-082937, filed on Mar. 27, 2008, the disclosure of which is incorporated herein in its entirety by reference.

What is claimed is:

1. A clock synchronization system which synchronizes the clock of a slave node with the clock of a master node by use of a timestamp packet transmitted from said master node to said slave node, wherein
said slave node comprises a processor and a memory storing instructions that when executed by the processor performs processing comprising:
calculating a difference between a received timestamp and a timestamp generated on the slave node side;
suppressing jitters and noises contained in the difference;
generating a control signal configured to ultimately reduce said difference to zero;
outputting a clock signal with a frequency corresponding to the generated control signal;
generating a clock signal with a frequency up-converted from the frequency of said clock signal;
outputting a timestamp based on the clock signal; and
increasing the resolution of the timestamp,
and wherein
increasing the resolution comprises:
obtaining a quotient by dividing the timestamp value by a magnification coefficient that represents the extent to which the resolution of the timestamp will be increased;
obtaining a value by further dividing the remainder of dividing said timestamp value by said magnification coefficient, again by said magnification coefficient; and
outputting a value of adding said quotient and the value obtained by dividing said remainder by said magnification coefficient.

2. The clock synchronization system of claim 1, wherein generating the clock signal comprises:
generating a clock signal with a frequency, which is a result of multiplying the frequency of the clock signal from said master node by a magnification coefficient which represents the extent by which the resolution should be increased.

3. The clock synchronization system of claim 1, wherein the processing further comprises:
monitoring delay jitters inside the network based on a timing error resulting from the difference and adjusting the resolution of the timestamp according to the amount of said delay jitters.

4. The clock synchronization system of claim 3, wherein said monitoring comprises:
upon receipt of the pre-set number of pieces of timing error information, calculating a variance of said delay jitters from said timing error information obtained.

5. The clock synchronization system of claim 4, wherein said monitoring further comprises:
based on the calculated variance of said delay jitters, obtaining an optimum resolution at which clock synchronization accuracy will be maximum.

6. The clock synchronization system of claim 5, wherein said monitoring further comprises:
in order to adjust said resolution to the optimum value, causing the frequency to be changed by up-converting and causing the magnification coefficient which represents the extent by which the resolution should be increased to be changed.

7. A node which synchronizes its clock with the clock of said master node by use of a timestamp packet transmitted from said master node within a packet network, comprising a processor and a memory storing instructions that when executed by the processor performs processing comprising:
calculating a difference between a received timestamp and a timestamp generated on the node side;
suppressing jitters and noises contained in the difference;
generating a control signal configured to ultimately reduce said difference to zero;
outputting a clock signal with a frequency corresponding to the generated control signal;
generating a clock signal with a frequency up-converted from the frequency of said clock signal;
outputting a timestamp based on the clock signal; and
increasing the resolution of the timestamp,
wherein
increasing the resolution comprises:
obtaining a quotient by dividing the timestamp value by a magnification coefficient that represents the extent to which the resolution of the timestamp will be increased;
obtaining a value by further dividing the remainder of dividing said timestamp value by said magnification coefficient, again by said magnification coefficient; and
outputting a value of adding said quotient and the value obtained by dividing said remainder by said magnification coefficient.

8. The node of claim 7, wherein generating the clock signal comprises:
generating a clock signal with a frequency, which is a result of multiplying the frequency of the clock signal from said master node by a magnification coefficient which represents the extent by which the resolution should be increased.

9. The node of claim 7, wherein the processing further comprises monitoring delay jitters inside the network based on the timing error received from said phase comparison unit and adjusting the resolution of the timestamp according to the amount of said delay jitters.

10. The node of claim 9, wherein said monitoring comprises:
upon receipt of the pre-set number of pieces of timing error information, calculating a variance of said delay jitters from said timing error information obtained.

11. The node of claim 10, wherein said monitoring further comprises:
based on the calculated variance of said delay jitters, obtaining an optimum resolution at which clock synchronization accuracy will be maximum.

12. The node of claim 11, wherein said monitoring further comprises:
in order to adjust said resolution to the optimum value, causing the frequency to be changed by up-converting and causing the magnification coefficient which represents the extent by which the resolution should be increased to be changed.

13. A clock synchronization method which synchronizes the clock of a slave node with the clock of a master node by use of a timestamp packet transmitted from said master node to said slave node, comprising:
at said slave node,
a phase comparison step of calculating a difference between a received timestamp and a timestamp generated on the slave node side;
a step of suppressing jitters and noises contained in the difference obtained by said phase comparison step;
a step of generating a control signal configured to ultimately reduce said difference to zero;
a clock output step of outputting a clock signal with a frequency corresponding to the generated control signal;
a frequency division step of generating a clock signal with a frequency up-converted from the frequency of said clock signal;
a timestamp generation step of outputting a timestamp based on the clock signal from said frequency division step; and
a resolution conversion step of increasing the resolution of the timestamp from said timestamp generation step,
wherein
at said resolution conversion step,
obtaining a quotient by dividing the timestamp value from said timestamp generation step by a magnification coefficient that represents the extent to which the resolution of the timestamp will be increased;
obtaining a value by further dividing the remainder of dividing said timestamp value by said magnification coefficient, again by said magnification coefficient; and
outputting a value of adding said quotient and the value obtained by dividing said remainder by said magnification coefficient.

14. The clock synchronization method of claim 13, wherein
at said frequency division step,
generating a clock signal with a frequency, which is a result of multiplying the frequency of the clock signal from said master node by a magnification coefficient which represents the extent by which the resolution should be increased.

15. The clock synchronization method of claim 13, wherein
said slave node includes a jitter monitoring step which monitors delay jitters inside the network based on the timing error received from said phase comparison step and adjusts the resolution of the timestamp according to the amount of said delay jitters.

16. The clock synchronization method of claim 15, wherein
at said jitter monitoring step,
upon receipt of the pre-set number of pieces of timing error information from said phase comparison step, calculating a variance of said delay jitters from said timing error information obtained.

17. The clock synchronization method of claim 16, wherein
at said jitter monitoring step,
based on the calculated variance of said delay jitters, obtaining an optimum resolution at which clock synchronization accuracy will be maximum.

18. The clock synchronization method of claim 17, wherein
at said jitter monitoring step,
in order to adjust said resolution to the optimum value, instructing said frequency division step to change the frequency by up-converting and said resolution conversion step to change the magnification coefficient which represents the extent by which the resolution should be increased.

19. A non-transitory computer-readable storage medium on which is encoded a clock synchronization program of machine-readable instructions which synchronizes the clock of a slave node with the clock of a master node by use of a timestamp packet transmitted from said master node to said slave node, wherein
said clock synchronization program causing said slave node to perform
a phase comparison process which calculates a difference between a received timestamp and a timestamp generated on the slave node side;
a process which suppresses jitters and noises contained in the difference obtained by said phase comparison process;
a process which generates a control signal configured to ultimately reduce said difference to zero;
a clock output process which outputs a clock signal with a frequency corresponding to the generated control signal;
a frequency division process which generates a clock signal with a frequency up-converted from the frequency of said clock signal;
a timestamp generation process which outputs a timestamp based on the clock signal from said frequency division process; and
a resolution conversion process which increases the resolution of the timestamp received from the timestamp generation process,
wherein said resolution conversion process
obtains a quotient by dividing the timestamp value from said timestamp generation process by a magnification coefficient that represents the extent to which the resolution of the timestamp will be increased;
obtains a value by further dividing the remainder of dividing said timestamp value by said magnification coefficient, again by said magnification coefficient; and
outputs a value of adding said quotient and the value obtained by dividing said remainder by said magnification coefficient.

20. The non-transitory computer-readable storage medium of claim 19, wherein said frequency division process generates a clock signal with a frequency, which is a result of multiplying the frequency of the clock signal from said master node by a magnification coefficient which represents the extent by which the resolution should be increased.

21. The non-transitory computer-readable storage medium of claim 19, wherein said slave node comprises a jitter monitoring process which monitors delay jitters inside the network based on the timing error received from said phase comparison unit and adjusts the resolution of the timestamp according to the amount of said delay jitters.

22. The non-transitory computer-readable storage medium of claim 21, wherein said jitter monitoring process upon receipt of the pre-set number of pieces of timing error information from said phase comparison unit, calculates a variance of said delay jitters from said timing error information obtained.

23. The non-transitory computer-readable storage medium of claim 22, wherein said jitter monitoring process based on the calculated variance of said delay jitters, obtains an optimum resolution at which clock synchronization accuracy will be maximum.

24. The non-transitory computer-readable storage medium of claim 23, wherein said jitter monitoring process in order to adjust said resolution to the optimum value, instructs said frequency division process to change the frequency by up-converting and said resolution conversion process to change the magnification coefficient which represents the extent by which the resolution should be increased.

* * * * *